United States Patent
Mizuno

(10) Patent No.: US 8,791,564 B2
(45) Date of Patent: Jul. 29, 2014

(54) METHOD OF MANUFACTURING A SEMICONDUCTOR MODULE AND DEVICE FOR THE SAME

(75) Inventor: Hiroki Mizuno, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/580,754

(22) PCT Filed: Feb. 24, 2010

(86) PCT No.: PCT/JP2010/052810
§ 371 (c)(1),
(2), (4) Date: Aug. 23, 2012

(87) PCT Pub. No.: WO2011/104826
PCT Pub. Date: Sep. 1, 2011

(65) Prior Publication Data
US 2012/0319253 A1    Dec. 20, 2012

(51) Int. Cl.
*H01L 23/10*    (2006.01)
*H01L 23/24*    (2006.01)

(52) U.S. Cl.
USPC ............ 257/706; 257/707; 257/712; 257/714

(58) Field of Classification Search
None
See application file for complete search history.

(56) References Cited

U.S. PATENT DOCUMENTS

| | | | |
|---|---|---|---|
| 8,169,789 B1 * | 5/2012 | Tong | 361/760 |
| 2008/0128896 A1 * | 6/2008 | Toh et al. | 257/712 |
| 2008/0290499 A1 * | 11/2008 | Nishi et al. | 257/712 |

FOREIGN PATENT DOCUMENTS

| | | |
|---|---|---|
| JP | 1-272123 A | 10/1989 |
| JP | 8-213724 A | 8/1996 |
| JP | 09-219582 A | 8/1997 |
| JP | 2000-357870 A | 12/2000 |
| JP | 2001-358263 A | 12/2001 |
| JP | 2003-332727 A | 11/2003 |
| JP | 2009-004436 A | 1/2009 |

OTHER PUBLICATIONS

International Search Report of PCT/JP2010/052810 mailed May 11, 2010.

* cited by examiner

*Primary Examiner* — Julio J Maldonado
*Assistant Examiner* — Harpreet Singh
(74) *Attorney, Agent, or Firm* — Kenyon & Kenyon LLP

(57) ABSTRACT

In the disclosed method for manufacturing a semiconductor module, a metal layer and a cooler, which have different coefficients of thermal expansion from each other, are joined into a single unit via an insulating resin sheet. A work, comprising a semiconductor element placed on the metal layer with solder interposed therebetween, is fed into a reflow furnace. The work, in that state, is heated in the reflow furnace, thereby mounting the semiconductor element to the metal layer. The heating is carried out such that the temperature of the cooler and the temperature of the metal layer differ by an amount that make the cooler and the metal layer undergo the same amount of thermal expansion as each other.

16 Claims, 4 Drawing Sheets

METHOD OF MANUFACTURING A SEMICONDUCTOR MODULE AND DEVICE FOR THE SAME

CROSS-REFERENCE TO RELATED APPLICATIONS

This is a 371 national phase application of PCT/JP2010/052810 filed on 24 Feb. 2010, the entire contents of which are incorporated herein by reference.

FIELD OF THE INVENTION

The present invention relates to a semiconductor module in which an electrode layer that mounts thereon a semiconductor element and a cooler are assembled together by interposing an insulating joining layer therebetween, and a manufacturing method of the semiconductor module. More specifically, the present invention relates to a manufacturing method and a manufacturing device for a semiconductor module to reduce peeling of an insulating joining layer.

BACKGROUND OF THE INVENTION

A high-pressure-resistant and large-current power module to be mounted in a hybrid electric vehicle, an electric vehicle, etc. provides a large self-heating value or amount during operation of a semiconductor element. Accordingly, such a vehicle-mounted power module has to include a cooling structure having high heat dissipation performance.

As the power module including the cooling structure, for example, there is known a configuration that an insulating resin sheet, a metal layer serving as an electrode, and a semiconductor element are laminated on a cooler having coolant flow passages. The semiconductor element is fixed to the metal layer with solder, and the metal layer and the cooler are joined through the insulating resin sheet. This power module is configured to efficiently release the heat generated from the semiconductor element by the cooler through the metal layer which is superior in thermal conductivity and the thin-layer insulating resin sheet.

As a device to solder an electronic component onto an electronic circuit board, for example, Patent Document 1 discloses a reflow device for mounting an electronic component onto an electronic circuit board by heating, melting, and then cooling solder. Patent Document 1 describes that this reflow device is arranged so that a heat shielding member having a plurality of openings is interposed between a far-infrared heater and a subject to be processed to partially adjust a heating temperature in the surface of the electronic circuit board.

RELATED ART DOCUMENTS

Patent Documents

Patent Document 1: JP 2003-332727A

SUMMARY OF THE INVENTION

Problems to be Solved by the Invention

However, the aforementioned conventional semiconductor modules have the following disadvantages. Specifically, since the metal layer and the cooler have a difference in coefficient of thermal expansion (coefficient of linear expansion), the insulating resin sheet is apt to peel off due to such a difference in coefficient of thermal expansion.

For instance, in the case where the metal layer is made of copper and the cooler is made of aluminum in the aforementioned conventional power module, in which the copper has a coefficient of linear expansion of about $17 \times 10^{-6}$/K and the aluminum has a coefficient of linear expansion of about $24 \times 10^{-6}$/K, a difference in thermal expansion amount is generated in a high-temperature environment where soldering is performed. Thus, shear stress occurs in the insulating resin sheet, causing peeling of the insulating resin sheet. This peeling could be caused even when the heating temperature in the surface of the electronic circuit board is partially adjusted as in the reflow device shown in Patent Document 1. Gaps generated due to the peeling may decrease the joint area between the insulating resin sheet serving as an insulating joining layer and the metal layer (or the cooler), thereby lowering a heat dissipation performance of the power module.

The present invention has been made to solve the aforementioned problems of the conventional semiconductor modules and has a purpose to provide a method of manufacturing a semiconductor module to reduce stress concentration in an insulating joining layer and prevent an insulating resin layer from peeling off.

Means of Solving the Problems

To achieve the above purpose, one aspect of the invention provides a method of manufacturing a semiconductor module, the module including: a semiconductor element: a metal layer on which the semiconductor element is mounted; a cooler consisting of a material having a coefficient of thermal expansion different from a coefficient of thermal expansion of the metal layer; and an insulating joining layer joining the metal layer and the cooler to each other and electrically insulating the metal layer and the cooler from each other, wherein the method includes a mounting process of heating a subject to be heated in which the metal layer and the cooler are joined integrally through the insulating joining layer and the semiconductor element is placed on the metal layer through solder, by heating the metal layer to a melting temperature of the solder and heating the cooler so that a thermal expansion amount of the cooler is equal to a thermal expansion amount of the metal layer.

The above semiconductor module manufacturing method is achieved by preparing a subject to be heated (a work) in which the metal layer and the cooler, which have different coefficients of thermal expansion (coefficients of linear expansion) from each other, are joined together through the insulating joining layer, and the semiconductor element is mounted on the metal layer with solder. The subject is heated to melt the solder, thereby joining the semiconductor element on the metal layer. During the heating of the subject, assuming that one of the metal layer and the cooling part, the one having a lower coefficient of thermal expansion, is a low thermal expansion member and the other having a higher coefficient of thermal expansion is a high thermal expansion member, the subject is heated so that the temperature of the low thermal expansion member becomes higher than that of the high thermal expansion member. To be concrete, the metal layer is heated to a melting temperature of the solder, and the cooler is heated so that the thermal expansion amount of the cooler becomes approximately equal to that of the metal layer. Specifically, if the cooler is the high thermal expansion member, the cooler is heated to a lower temperature than the metal layer. On the other hand, if the cooler is the low thermal expansion member, the cooler is heated to a higher temperature than the metal layer.

In the above semiconductor module manufacturing method, the metal layer and the cooler are heated to different temperatures from each other so that their thermal expansion amounts are equal to each other. According to this method, it can be expected to reduce shear stress occurring in the insulating joining layer as compared with the conventional case where the metal layer and the cooler are heated to an almost equal temperature. It is therefore expected to prevent the insulating joining layer from peeling.

The above mounting process preferably includes heating the subject from both sides in a height direction of the subject by a first heating member for heating the subject from above and a second heating member for heating subject from below, and controlling at least one of the first heating member and the second heating member so that the thermal expansion amount of the high thermal expansion member and the thermal expansion amount of the low thermal expansion member are approximately equal to each other. When the subject is heated from both sides in a height direction of the subject and the temperature of at least one of the heating members is controlled, the temperature difference can be provided with high precision.

The above mounting process preferably includes heating the subject from a semiconductor element side in the height direction of the subject by a radiation-heating type heating device, and holding a shielding member on at least a surface of the cooler facing to the semiconductor element to shield radiation from the heating device while the heating device heats the subject. As this configuration, when an upper surface (an exposed portion) of the cooler is covered by the shielding member to restrict heating of the cooler, the temperature difference between the cooler and the metal layer is easily provided.

Preferably, the mounting process includes heating the subject while cooling the high thermal expansion member. For the cooling device, for example, an air blow or a cooling plate is available. Since the high thermal expansion member is cooled by such a cooling device, the temperature difference is more easily provided.

Another aspect of the invention provides a semiconductor module including: a semiconductor element; a metal layer on which the semiconductor element is mounted; a cooler consisting of a material having a coefficient of thermal expansion different from a coefficient of thermal expansion of the metal layer; and an insulating joining layer joining the metal layer and the cooler to each other and electrically insulating the metal layer and the cooler from each other; and a shielding film electrically insulated from the metal layer and provided to cover a surface of the cooler: facing to the semiconductor element to shield radiation.

Still another aspect of the invention provides a device for manufacturing a semiconductor module, the module including: a semiconductor element; a metal layer on which the semiconductor element is mounted; a cooler consisting of a material having a coefficient of thermal expansion different from a coefficient of thermal expansion of the metal layer; and an insulating joining layer joining the metal layer and the cooler to each other and electrically insulating the metal layer and the cooler from each other, wherein the device includes: a heating chamber for accommodating a subject to be heated, the subject being configured such that the metal layer and the cooler are integrally joined through the insulating joining layer and the semiconductor element is placed on the metal layer with solder, and a heating device for heating the subject by heating the metal layer to a melting temperature of the solder and heating the cooler so that the thermal expansion amount of the cooler is equal to a thermal expansion amount of the metal layer.

Effects of the Invention

According to the invention, a method of manufacturing a semiconductor module can be achieved capable of reducing stress concentration in an insulating joining layer and preventing peeling of the insulating joining layer.

DETAILED DESCRIPTION

A detailed description of a preferred embodiment of the present invention will now be given referring to the accompanying drawings. In the following explanation, the invention is applied to an intelligent power module for hybrid vehicle.

First Embodiment

Configuration of Power Module

Figure 1:
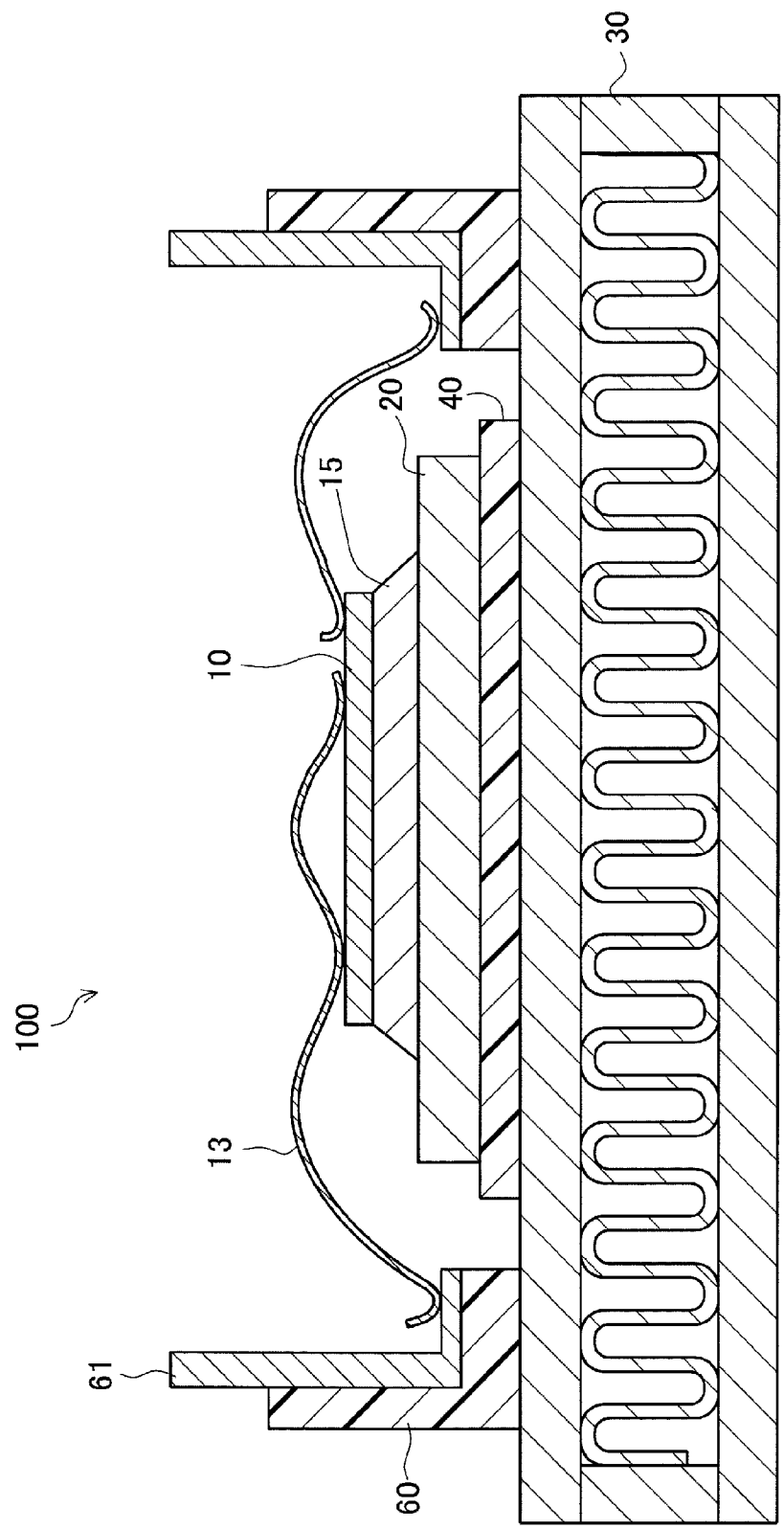
FIG. 1 is a configuration view of a power module in an embodiment.

A power module 100 of this embodiment includes, as shown in FIG. 1, a semiconductor element 10 which is a heat generating element, a metal layer 20 on which the semiconductor element 10 is mounted, a cooler 30 internally formed with coolant flow passages, an insulating resin sheet 40 that insulates the metal layer 20 and the cooler 30 from each other and joins them to each other, and a bus bar housing 60 fixed on the cooler 30 and holding a bus bar 61. The power module 100 is configured to dissipate the heat generated in the semiconductor element 10 to the cooler 30 through the metal layer 20 and the insulating resin sheet 40.

The power module 100 is assembled as shown in FIG. 1 such that the insulating resin sheet 40, the metal layer 20, and the semiconductor element 10 are laminated on the cooler 30. In this description, this lamination direction is referred to as a height direction, the semiconductor element 10 side in the height direction is referred to as an upper side, and the cooler 30 side in the height direction is referred to as a lower side.

The semiconductor element 10 is a device such as IGBT constituting an inverter circuit and is electrically connected to the bus bar 61 in the bus bar housing 60 with bonding wires 13. The semiconductor element 10 is mounted on the metal layer 20 and fixed thereto with solder 15. It is to be noted that a vehicle-mounted power module mounts thereon many semiconductor elements, but it is schematically illustrated in the present description to simplify the explanation.

The metal layer 20 is a board on which the semiconductor element 10 is mounted. The metal layer 20 serves as an electrode and also as a heat dissipating plate to dissipate the heat from the semiconductor element 10. Accordingly, the metal layer 20 is made of a material having high thermal conductivity and high electric conductivity. In the present embodiment, the metal layer 20 is made of copper (Cu) having a thickness of 2 mm to 3 mm.

The insulating resin sheet 40 is a joining sheet for bonding the cooler 30 and the metal layer 20 together. Further, the insulating resin sheet 40 also has a function to electrically insulate the cooler 30 and the metal layer 20 from each other. As the insulating resin sheet 40, therefore, a sheet having a joining function and an insulating function is used. In the present embodiment, the insulating resin sheet 40 is made of epoxy-system thermosetting resin with a thickness of about 200 μm.

The cooler 30 has cooling fins each of which is formed of a rolled sheet shaped in wave form, and a top plate and a bottom plate that fix the cooling fins interposed therebetween. Each component constituting the cooler 30 is made of aluminum (Al) having high thermal conductivity and light weight. A hollow area defined by the top plate, the bottom plate, and the cooling fins provides flow passages for coolant. The coolant may be selected from liquid and gas. The components constituting the cooler 30 are integrally joined together with a brazing material in order to efficiently transfer the heat from the semiconductor element 10 to the cooler 30. Available brazing materials are aluminum brazing materials such as Al—Si alloy and Al—Si—Mg alloy. The cooler 30 configured as above is one example and not limited thereto.

In the present embodiment, a coefficient of linear expansion of the metal layer 20 made of copper is about $17 \times 10^{-6}$/K and a coefficient of linear expansion of the cooler 30 made of aluminum is about $24 \times 10^{-6}$/K. Thus, there is a difference in coefficient of linear expansion (coefficient of thermal expansion) between the metal layer 20 and the cooler 30. The cooler 30 is easier to expand than the metal layer 20.

<Reflow Furnace>

The reflow furnace for mounting the semiconductor element 10 of the power module 100 will be explained below. A reflow furnace 200 in the present embodiment includes, as shown in FIG. 2, a heating chamber 201 to accommodate a work 1, a radiation-heating type heater 202 placed in an upper side in the heating chamber 201 and configured to emit radiation to heat the work 1, a hot plate 203 located in a lower side in the heating chamber 201 to hold thereon the work 1 and heat the work 1, shielding plates 204 and 205 to block the passage of radiation from the heater 202, and an air blow gun 206 configured to inject cooling air in the heating chamber 201.

The work 1 in the present embodiment corresponds to the power module 100 to which the semiconductor element 10 is not yet soldered. In other words, for example, the work 1 is in a state where the semiconductor element 10 is placed on cream solder printed on the metal layer 20. In the work 1, the metal layer 20 and the cooler 30 are bonded together through the insulating resin sheet 40.

Figure 2:
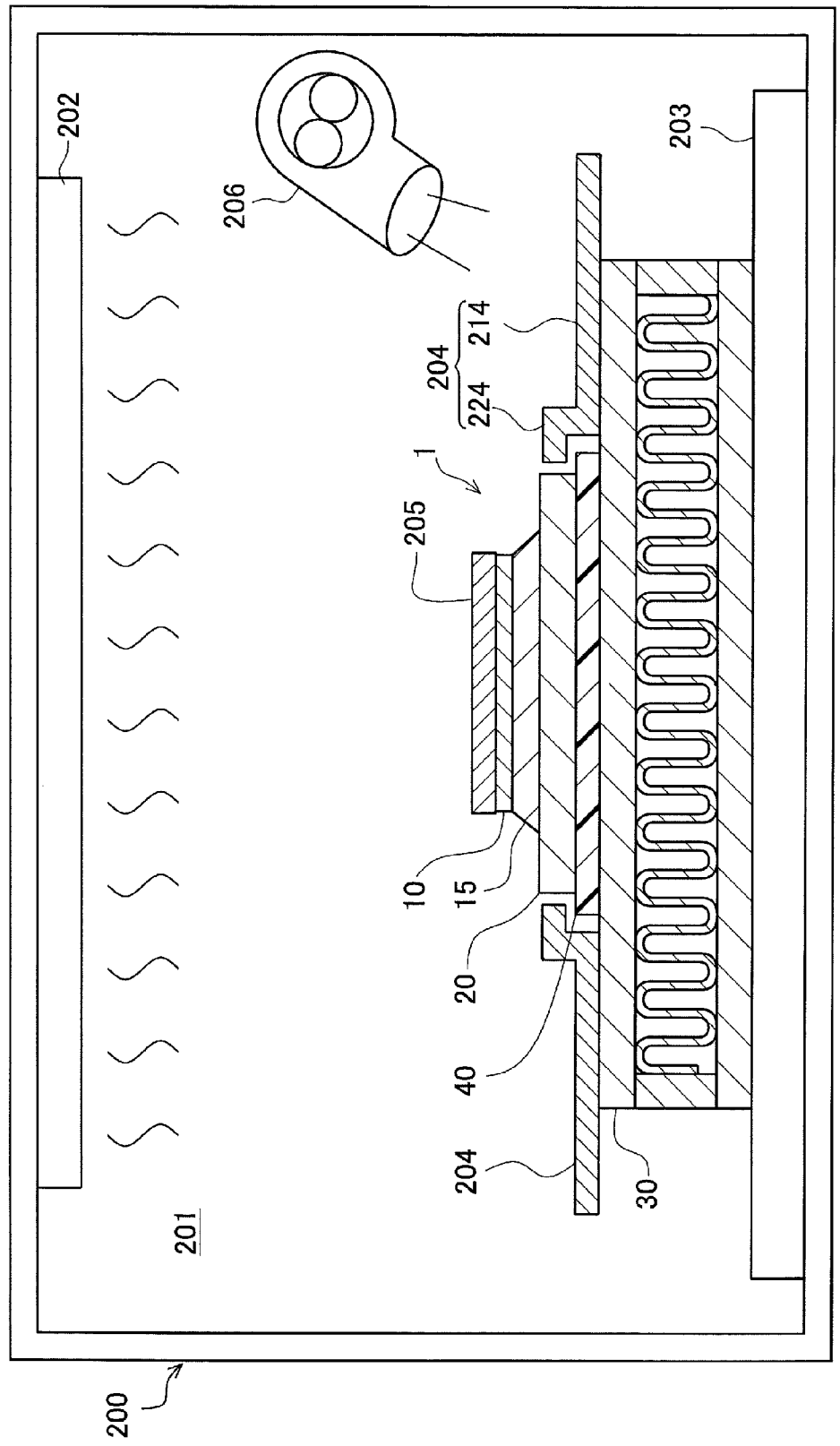
FIG. 2 is a configuration view of a reflow furnace in the embodiment.

In the reflow furnace 200, as shown in FIG. 2, the work 1 is placed on the hot plate 203. By the heat from the hot plate 203, the work 1 is heated from below. Further, the work 1 is placed below the heater 202 and thus heated from above by the radiation from the heater 202. In other words, the reflow furnace 200 is configured to heat the work 1 from both sides, above and below, in the height direction.

The shielding plates 204 and 205 are movably provided in the heating chamber 201. During heating of the work 1, the shielding plate 204 covers upper surfaces (especially, exposed portions) of the cooler 30 and the insulating resin sheet 40 and the shielding plate 205 covers an upper surface of the semiconductor element 10. Specifically, the shielding plates 204 and 205 cover other portions than the metal layer 20 of the work 1 when seen from above in the height direction of the work 1. The shielding plates 204 and 205 may be made of any materials capable of reflecting the radiation form the heater 202 to restrain the passage of radiation. In the present embodiment, the plates 204 and 205 are steel plates whose surfaces coated with Au plating.

The shielding plate 204 includes, as shown in FIG. 2, a shielding part 214 for covering the upper surface of the cooler 30 and a shielding part 224 for covering the upper surface of the insulating resin sheet 40. The shielding plate 204 is formed in a shape including the shielding parts 214 and 224 integrally.

The shielding part 214 and the shielding part 224 of the shielding plate 204 may be provided as separate parts. For instance, the shielding plates 204 and 205 may consist of a plurality of parts which are assembled to cover necessary portions of the work 1 or may be formed of a single plate having a cutout(s) corresponding to an uncovered portion(s) (the metal layer 20 in this embodiment) of a work.

The air blow gun 206 is movably provided in the heating chamber 201. This gun 206 injects cooling air toward a portion or portions difficult to be covered by the shielding plate 204 of the cooler 30, thereby cooling the surface of the cooler 30. In the case where it is unnecessary to cool the cooler 30 by use of the air blow gun 206 (e.g., in the case where temperature control mentioned later is enabled by using only the shielding plates 204 and 205), the air blow gun 206 is held outside the heating chamber 201.

<Soldering Procedure>

A soldering procedure in the power module 100 by use of the aforementioned reflow furnace 200 will be explained below.

The work 1 is first put on the hot plate 203 as shown in FIG. 2. Further, the shielding plates 204 and 205 are moved to between the work 1 and the heater 202. To be concrete, the shielding plate 204 is placed to cover the upper surfaces of the cooler 30 and the insulating resin sheet 40, while the shielding plate 205 is placed to cover the upper surface of the semiconductor element 10.

Subsequently, heating using the heater 202 and the hot plate 203 is started. Specifically, the metal layer 20 is heated to at least a melting temperature of the solder 15. At that time, the metal layer 20 uncovered with the shielding plates 204 and 205 absorbs the radiation from the heater 202. Accordingly, the metal layer 20 is heated by the heater 202. As the metal layer 20 is heated, the heat is transferred to the solder 15, and thus the solder 15 is melted.

The cooler 30 and the insulating resin sheet 40 each being covered by the shielding plate 204 hardly absorb the radiation from the heater 202. Thus, the cooler 30 and the insulating resin sheet 40 are not influenced by the radiation from the heater 202. Similarly, the semiconductor element 10 covered by the shielding plate 205 is little influenced by the radiation from the heater 202.

In the cooler 30 side, on the other hand, the cooler 30 is heated by the hot plate 203. In the reflow furnace 200, concretely, heating control of the hot plate 203 is performed so that a thermal expansion amount (i.e., an expanding amount in a width direction) of the cooler 30 is approximately equal to that of the metal layer 20. When soldering is to be performed at 300° C., the work 1 is heated by the radiation from the heater 202 so that the temperature of the metal layer 20 reaches 300° C., while the cooler 30 side is controlled so that the temperature of the cooler 30 becomes 212° C. While the work 1 is heated by the heater 202 and the hot plate 203, the temperature of the metal layer 20 and the temperature of the cooler 30 are continuously detected and the temperature of the cooler 30 is increased following the increasing temperature of the metal layer 20 so that their thermal expansion amounts are approximately equal to each other. Specifically, the hot plate 203 is controlled to maintain a difference in thermal expansion amount between the metal layer 20 and the cooler 30 within a predetermined value.

In this reflow process (one example of the mounting process), a difference in temperature is provided between the metal layer 20 and the cooler 30 so that the difference in thermal expansion amount between the metal layer 20 and the cooler 30 is a threshold value or less. Since the control is performed to prevent the occurrence of a difference in thermal expansion amount between the metal layer 20 and the cooler 30, the insulating resin sheet 40 is less likely to be deformed or warped and hence stress concentration is restrained.

During adjustment of the temperature of the cooler 30, the temperature of the cooler 30 is adjusted simply by heating control of the hot plate 203. As an alternative, the air blow gun 206 may be used to blow cooling air to the cooler 30 for the purpose of fine adjustment of the temperature of the cooler 30. As another alternative, instead of using the shielding plates 204 and 205, the cooler 30 may be cooled by cooling air to provide a temperature difference between the metal layer 20 and the cooler 30.

Figure 3:
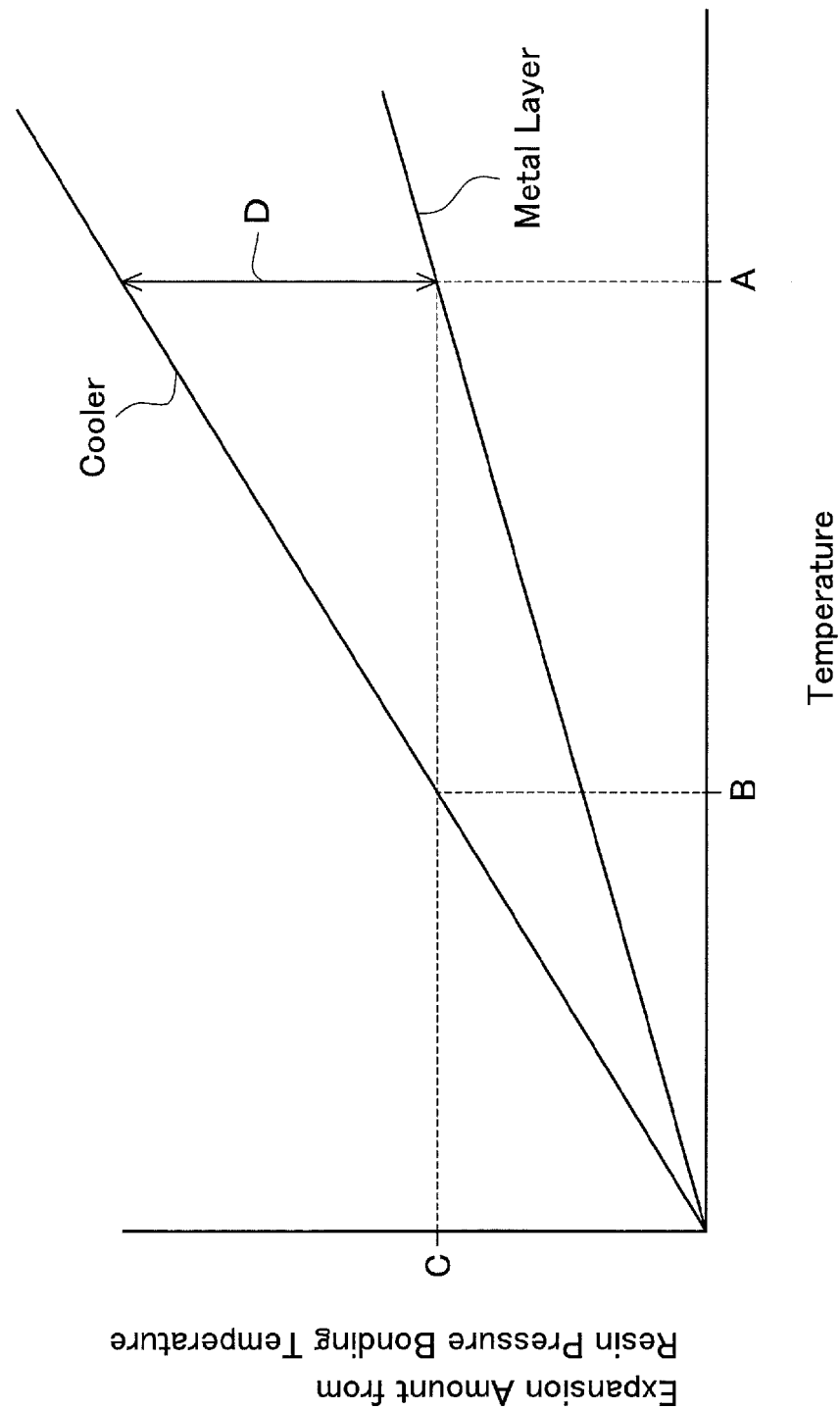
FIG. 3 is a graph showing a relationship between temperature and thermal expansion amount of a subject to be heated.

FIG. 3 shows a relationship between temperature and coefficient of thermal expansion of a subject to be heated. In the conventional example, both the temperature of the metal layer 20 and the temperature of the cooler 30 are increased to the melting temperature (a sign A in FIG. 3) of the solder 15. That is, the temperature of the metal layer 20 and the temperature of the cooler 30 are equal to each other. Accordingly, a difference in thermal expansion amount occurs due to the difference in coefficient of thermal expansion as indicated by a sign D in FIG. 3. This causes peeling of the insulating resin sheet 40.

In the present embodiment, in contrast, the temperature of the metal layer 20 and the temperature of the cooler 30 are controlled to be different from each other so that their thermal expansion amounts are equal to each other. In the present embodiment, specifically, the coefficient of thermal expansion of the cooler 30 is higher than that of the metal layer 20. Therefore, the temperature of the cooler 30 is made lower than the metal layer 20 so that the thermal expansion amount of the cooler 30 is equal to the metal layer 20. For instance, when the metal layer 20 reaches the temperature A in FIG. 3, the temperature of the cooler 30 is adjusted to a temperature B at which the thermal expansion amount of the cooler 30 becomes equal to a thermal expansion amount C of the metal layer 20. In the present embodiment, the thermal expansion amounts are equal as above, so that the insulating resin sheet 40 is less warped. This can consequently prevent peeling of the insulating resin sheet 40.

Second Embodiment

Configuration of Power Module

Figure 4:
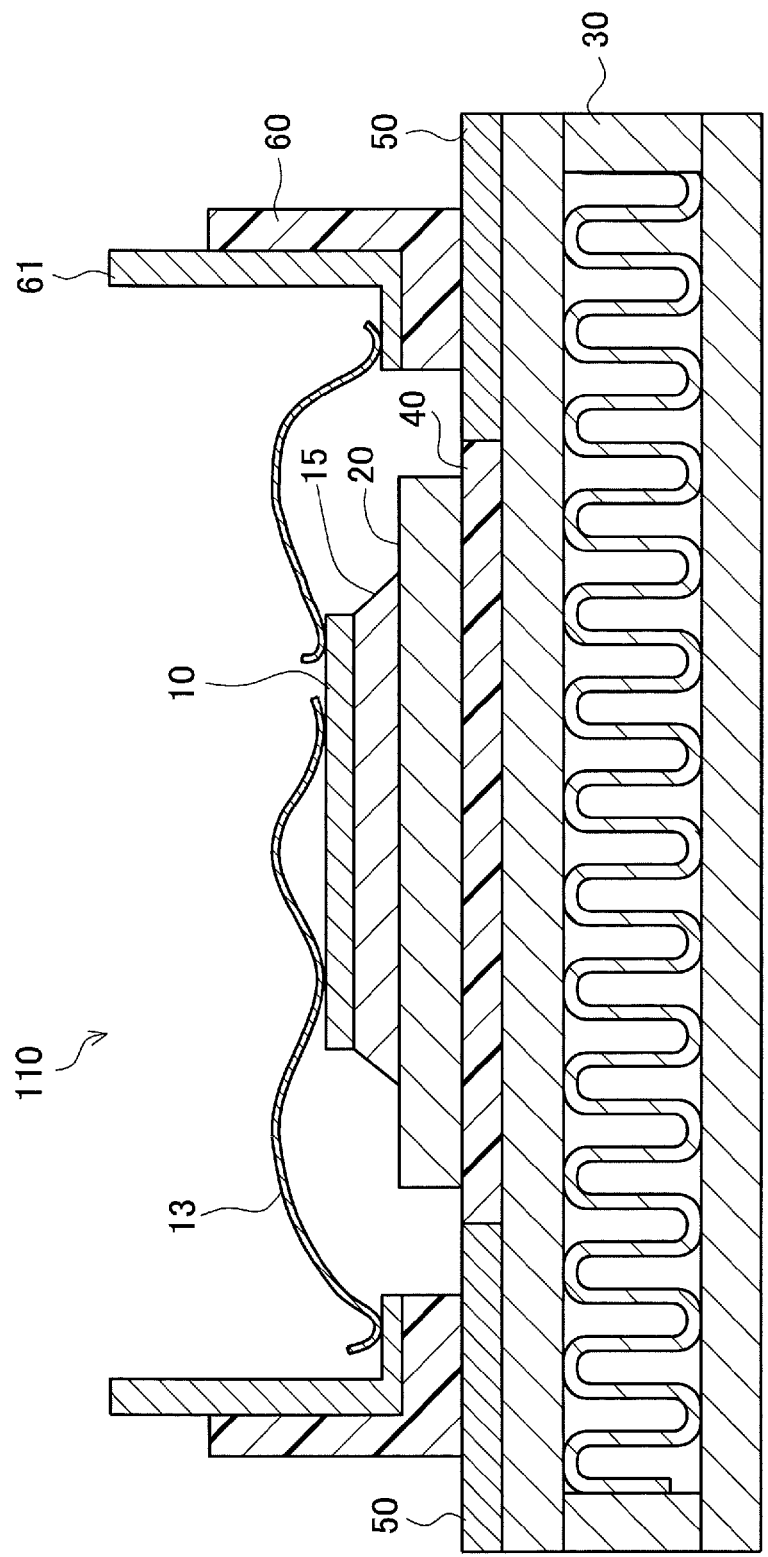
FIG. 4 is a configuration view of a power module in a modified example.

A power module 110 in a second embodiment is configured, as shown in FIG. 4, such that a shielding film 50 covers a portion of a surface of the cooler 30 facing to the semiconductor element 10, the portion being in noncontact with the insulating resin sheet 40. The bus bar housing 60 is fixed onto the shielding film 50.

The shielding film 50 reflects the radiation from the heater 202 to restrain the passage of radiation. For example, an Au film is usable. Specifically, the shielding film 50 has a function similar to the shielding plates 204 and 205 of the reflow furnace 200. Further, the shielding film 50 is in noncontact with the metal layer 20 and electrically insulated from the metal layer 20 by the insulating resin sheet 40.

In the power module 110, the surface of the cooler 30 facing to the heater 202 is covered by the shielding film 50. Thus, the heater 202 does not contribute to heating of the cooler 30. Accordingly, in a similar manner to the first embodiment, a temperature difference can be provided between the metal layer 20 and the cooler 30.

Since the power module 110 is provided in itself with a shielding member, any shielding plate does not need to be provided in the reflow furnace as disclosed in the first embodiment. Even when the configuration of the power module is changed, therefore, there is no need to change the configuration of the reflow furnace. Therefore, the reflow furnace has a simpler configuration than that in the first embodiment.

On the other hand, in the case where the shielding plate is provided in the reflow furnace as in the first embodiment, the power module does not need any shielding film. Thus, the number of components of the power module can be small. Further, manufacturing of such cooler needs no step of covering the cooler by the shielding film and the cooler can be made simpler than that in the second embodiment.

As explained in detail above, in the soldering process of the power module in the present embodiments, the work 1 is heated so that the metal layer 20 (a low thermal expansion member) becomes higher in temperature as compared with the cooler 30 (a high thermal expansion member). Specifically, the metal layer 20 is heated to a melting temperature of the solder 15 and the cooler 30 is heated to have a thermal expansion amount approximately equal to the thermal expansion amount of the metal layer 20. Since the metal layer 20 and the cooler 30 are heated as above to different temperatures, their thermal expansion amounts are little different from each other as compared with the case where the metal layer 20 and the cooler 30 are heated to almost the same temperature. Accordingly, shear stress generated in the insulating resin sheet 40 is small and thus it can be expected to prevent peeling of the insulating resin sheet 40.

The above embodiments are mere examples and do not give any limitations to the present invention. The present invention therefore may be embodied in other specific forms without departing from the essential characteristics thereof. For instance, although the above embodiments show that the present invention is applied to the intelligent power module for hybrid vehicle, the invention is also applicable to general modules including electronic components mounted on electronic circuit boards.

Although the radiation-heating type heater 202 and the hot plate 203 are used as heating devices for heating the work 1 in the above embodiments, the invention is not limited thereto. For instance, the work 1 may be heated by heated air, laser heating, arc heating, electromagnetic induction heating, electronic beam heating, or ion beam heating.

In the above embodiments, the cooling air from the air blow gun 206 is used as a cooling device for cooling the work 1, but the invention is not limited thereto. For instance, the work 1 may be cooled by a cooling plate, cooling water, or compression cooling.

In the above embodiments, the sheet-like member 40 is used as a member for joining the metal layer 20 and the cooler 30 and insulating them from each other. Instead of such a sheet-like member, a plate-like member (a ceramic insulating plate, etc.) may be used.

In the above embodiments, on ground that the coefficient of thermal expansion of the cooler 30 is higher than that of the metal layer 20, heating of the metal layer 20 and the cooler 30 is controlled so that the temperature of the cooler 30 is lower than the temperature of the metal layer 20. However, the invention is not limited to such heating control. In the case where the coefficient of thermal expansion of the cooler 30 is lower than that of the metal layer 20, heating is controlled so that the temperature of the cooler 30 is higher than that of the metal layer 20, thereby making their thermal expansion amounts equal to each other.

DESCRIPTION OF THE REFERENCE SIGNS

1 Work (Subject to be heated)
10 Semiconductor element
15 Solder
20 Metal layer
30 Cooler
40 Insulating resin sheet (Insulating joining layer)
100 Power module (Semiconductor module)
200 Reflow furnace
201 Heating chamber
202 Radiation-heating type heater
203 Hot plate
204 Shielding plate

The invention claimed is:

1. A method of manufacturing a semiconductor module, the module including:
   a semiconductor element:
   a metal layer on which the semiconductor element is mounted;
   a cooler consisting of a material having a coefficient of thermal expansion different from a coefficient of thermal expansion of the metal layer; and
   an insulating joining layer joining the metal layer and the cooler to each other and electrically insulating the metal layer and the cooler from each other,
   wherein the method includes a mounting process of heating a subject to be heated in which the metal layer and the cooler are joined integrally through the insulating joining layer and the semiconductor element is placed on the metal layer through solder, by heating the metal layer to a melting temperature of the solder and heating the cooler so that a thermal expansion amount of the cooler is approximately equal to a thermal expansion amount of the metal layer.

2. The method of manufacturing a semiconductor module according to claim 1, wherein the mounting process includes heating the subject from both sides in a height direction of the subject by a first heating member for heating the subject from above and a second heating member for heating subject from below, and controlling at least one of the first heating member and the second heating member so that the thermal expansion amount of the cooler and the thermal expansion amount of the metal layer are approximately equal to each other.

3. The method of manufacturing a semiconductor module according to claim 1, wherein the mounting process heating the subject from a semiconductor element side in the height direction of the subject by a radiation-heating type heating device, and holding a shielding member on at least a surface of the cooler facing to the semiconductor element to shield radiation from the heating device while the heating device heats the subject.

4. The method of manufacturing a semiconductor module according to claim 1, wherein the mounting process includes heating the subject while cooling the high thermal expansion member that is one of the cooler and the metal layer, the one having a higher coefficient of thermal expansion than the other.

5. A device for manufacturing a semiconductor module, the module including:
   a semiconductor element;
   a metal layer on which the semiconductor element is mounted;
   a cooler consisting of a material having a coefficient of thermal expansion different from a coefficient of thermal expansion of the metal layer; and
   an insulating joining layer joining the metal layer and the cooler to each other and electrically insulating the metal layer and the cooler from each other,
   wherein the device includes:
   a heating chamber for accommodating a subject to be heated, the subject being configured such that the metal layer and the cooler are integrally joined through the insulating joining layer and the semiconductor element is placed on the metal layer with solder, and
   a heating device for heating the subject by heating the metal layer to a melting temperature of the solder and heating the cooler so that a thermal expansion amount of the cooler is approximately equal to a thermal expansion amount of the metal layer.

6. The device for manufacturing a semiconductor module according to claim 5, wherein the heating device includes:
   a first heating member for heating the subject from above in a height direction of the subject; and
   a second heating member for heating the subject from below in the height direction of the subject,
   wherein at least one of the first heating member and the second heating member is controlled so that a thermal expansion amount of the cooler and a thermal expansion amount of the metal layer are approximately equal to each other.

7. The device for manufacturing a semiconductor module according to claim 5, wherein
   the heating device is a radiation-heating type heating device for heating the subject from a semiconductor element side in the height direction of the subject,
   the device includes a shielding member for shielding radiation from the heating device, and
   the shielding member is placed on at least a surface of the cooler facing to the semiconductor element while the heating device heats the subject.

8. The device for manufacturing a semiconductor module according to claim 5 further including a cooling device for cooling the high thermal expansion member that is one of the cooler and the metal layer, the one having a higher coefficient of thermal expansion than the other.

9. The method of manufacturing a semiconductor module according to claim 2, wherein the mounting process heating the subject from a semiconductor element side in the height direction of the subject by a radiation-heating type heating device, and holding a shielding member on at least a surface of the cooler facing to the semiconductor element to shield radiation from the heating device while the heating device heats the subject.

10. The method of manufacturing a semiconductor module according to claim 2, wherein the mounting process includes heating the subject while cooling the high thermal expansion member that is one of the cooler and the metal layer, the one having a higher coefficient of thermal expansion than the other.

11. The method of manufacturing a semiconductor module according to claim 3, wherein the mounting process includes heating the subject while cooling the high thermal expansion member that is one of the cooler and the metal layer, the one having a higher coefficient of thermal expansion than the other.

12. The method of manufacturing a semiconductor module according to claim 9, wherein the mounting process includes heating the subject while cooling the high thermal expansion member that is one of the cooler and the metal layer, the one having a higher coefficient of thermal expansion than the other.

13. The device for manufacturing a semiconductor module according to claim 6, wherein
the heating device is a radiation-heating type heating device for heating the subject from a semiconductor element side in the height direction of the subject,
the device includes a shielding member for shielding radiation from the heating device, and
the shielding member is placed on at least a surface of the cooler facing to the semiconductor element while the heating device heats the subject.

14. The device for manufacturing a semiconductor module according to claim 6 further including a cooling device for cooling the high thermal expansion member that is one of the cooler and the metal layer, the one having a higher coefficient of thermal expansion than the other.

15. The device for manufacturing a semiconductor module according to claim 7 further including a cooling device for cooling the high thermal expansion member that is one of the cooler and the metal layer, the one having a higher coefficient of thermal expansion than the other.

16. The device for manufacturing a semiconductor module according to claim 13 further including a cooling device for cooling the high thermal expansion member that is one of the cooler and the metal layer, the one having a higher coefficient of thermal expansion than the other.

* * * * *